United States Patent [19]

Bateman et al.

[11] Patent Number: 4,947,440

[45] Date of Patent: Aug. 7, 1990

[54] SHAPING OF AUTOMATIC AUDIO CROSSFADE

[75] Inventors: Robert Bateman, Nevada City; Donald R. Christensen, Grass Valley, both of Calif.

[73] Assignee: The Grass Valley Group, Inc., Nevada City, Calif.

[21] Appl. No.: 263,293

[22] Filed: Oct. 27, 1988

[51] Int. Cl.[5] .................................................. H03G 3/00

[52] U.S. Cl. ...................................... 381/107; 381/119

[58] Field of Search .................... 381/119, 117, 107, 1, 381/627, 702; 84/1.27

[56] References Cited

U.S. PATENT DOCUMENTS

| | | | |
|---|---|---|---|
| 3,020,343 | 2/1962 | Aldridge, Jr. | 381/119 |
| 3,647,928 | 3/1972 | Turner | 84/1.24 |
| 3,868,585 | 2/1975 | Richmond | 330/124.5 |
| 4,306,114 | 12/1981 | Callahan | 381/119 |
| 4,706,537 | 11/1987 | Oguri | 84/1.26 |

OTHER PUBLICATIONS

Auto Cross-Fader, David Edwards, Electronics Australia, Jan. 1978, vol. 39, No. 10, pp 48–51.

*Primary Examiner*—Forester W. Isen

*Attorney, Agent, or Firm*—Francis I. Gray

[57] ABSTRACT

Shaping of automatic audio crossfade is accomplished by adding a shaping function to the theoretical logarithmic crossfade function to decrease the rate of gain change at the limit of audibility. The gain change at each sample time within a crossfade interval is computed as a logarithmic function of the fractional part of the crossfade interval completed and the gain differential between the sources. The shaping function may be in the form of a cosine function that can be accessed with a look-up table that is added to the fractional part of the crossfade interval so that the gain change is expressed by:

ti $G_{delta}=20*\log\{(k-s(k))*10^{(G_1-G_2)/10}\}$ where S(k) is the shaping function, k is the fractional part complete and $G_1-G_2$ is the gain differential between sources. The gain change is added to the current gain for the particular audio source and applied to a variable gain element for that source. The outputs of the variable gain elements are summed to produce the resulting output audio mix.

5 Claims, 2 Drawing Sheets

SHAPING OF AUTOMATIC AUDIO CROSSFADE

BACKGROUND OF THE INVENTION

The present invention relates to audio mixers, and more particularly to the shaping of automatic audio crossfades to provide a more pleasingly aesthetic sound as a transition is made from one audio mix to another.

In audio production one commonly performed operation is a crossfade where a controlled smooth transition is made between one audio mix and another. On a manually controlled system an operator fades up a source being brought into the mix while fading out another source being removed. Due to the nature of sound the sources must be mixed in such a manner that both sources are down 6 dB from their full on settings midway through the mix. Mixing systems have been developed to automate this process, using addition rules for sound sources in the mixing algorithm. An automatic crossfade using the theoretical algorithm results in a transition that some listeners find too abrupt because at either end of the transition the level of the lower gain source is changing rapidly and is perceived as a cut rather than a fade. Human operators instinctively correct for this abruptness at the ends of the crossfade by modifying their manual motion. The perceived cut effect is exaggerated if the automatic control system runs on a sampling rather than continuous basis where large gain changes cannot be produced smoothly.

Therefore what is desired is an automatic audio crossfade process that modifies the theoretical crossfade algorithm to produce a smooth transition that is pleasing to a listener.

SUMMARY OF THE INVENTION

Accordingly the present invention provides shaping for an automatic audio crossfade by modifying a theoretical crossfade algorithm such that the rate of change of the level of the lower gain source at the limit of audibility is decreased. For theoretical crossfade the gain change per sample time increment is determined by taking the total gain change in dB, converting to a gain ratio and dividing by the total number of samples. This fraction of the total gain ratio is then converted back to dB and added to the original gain. Added to this logarithmic function is a correction to give an "S" shaping to the crossfade by adding another function, such as a cosine-based function, to the fraction completed term. The amount of the correction is determined with a table look-up, and results in the slope of the crossfade being decreased at the limit of audibility to produce an aesthetically pleasing transition sound.

The objects, advantages and other novel features of the present invention are apparent from the following detailed description when read in conjunction with the appended claims and attached drawing.

DESCRIPTION OF THE PREFERRED EMBODIMENT

Figure 1:
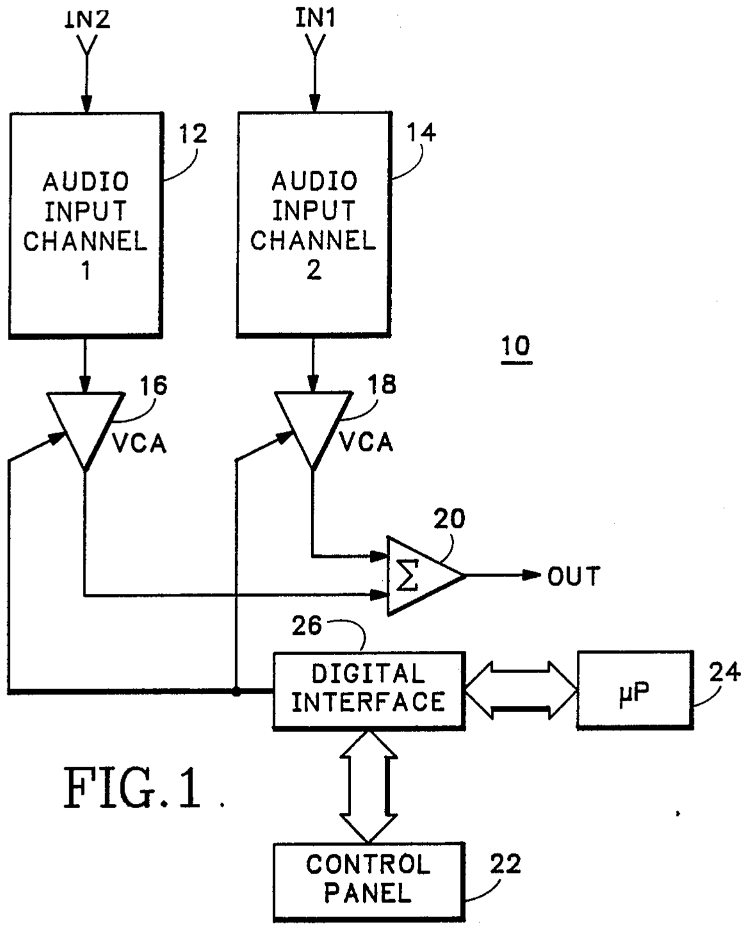
FIG. 1 is a simplified block diagram view of an audio mixer architecture suitable for using the present invention.

Referring now to FIG. 1 an audio mixer 10 is shown having two audio input channels 12, 14 for receiving audio signals IN1, IN2 from two different audio sources (not shown). The outputs of the audio input channels 12, 14 are input to respective variable gain elements 16, 18, the outputs of which are in turn input to a summer 20. The output of the summer 20 is an audio mix output. The audio mix between the audio sources is controlled either manually from a control panel 22 or automatically by a microprocessor 24. A digital interface 26 has analog outputs coupled to the variable gain elements 16, 18 to provide a gain control signal to vary the gain of the signals input to the summer 20. The digital interface 26 performs digital to analog and analog to digital conversions as necessary to transfer information between the control panel 22 the microprocessor 24 and the gain elements 16, 18.

Figure 2:
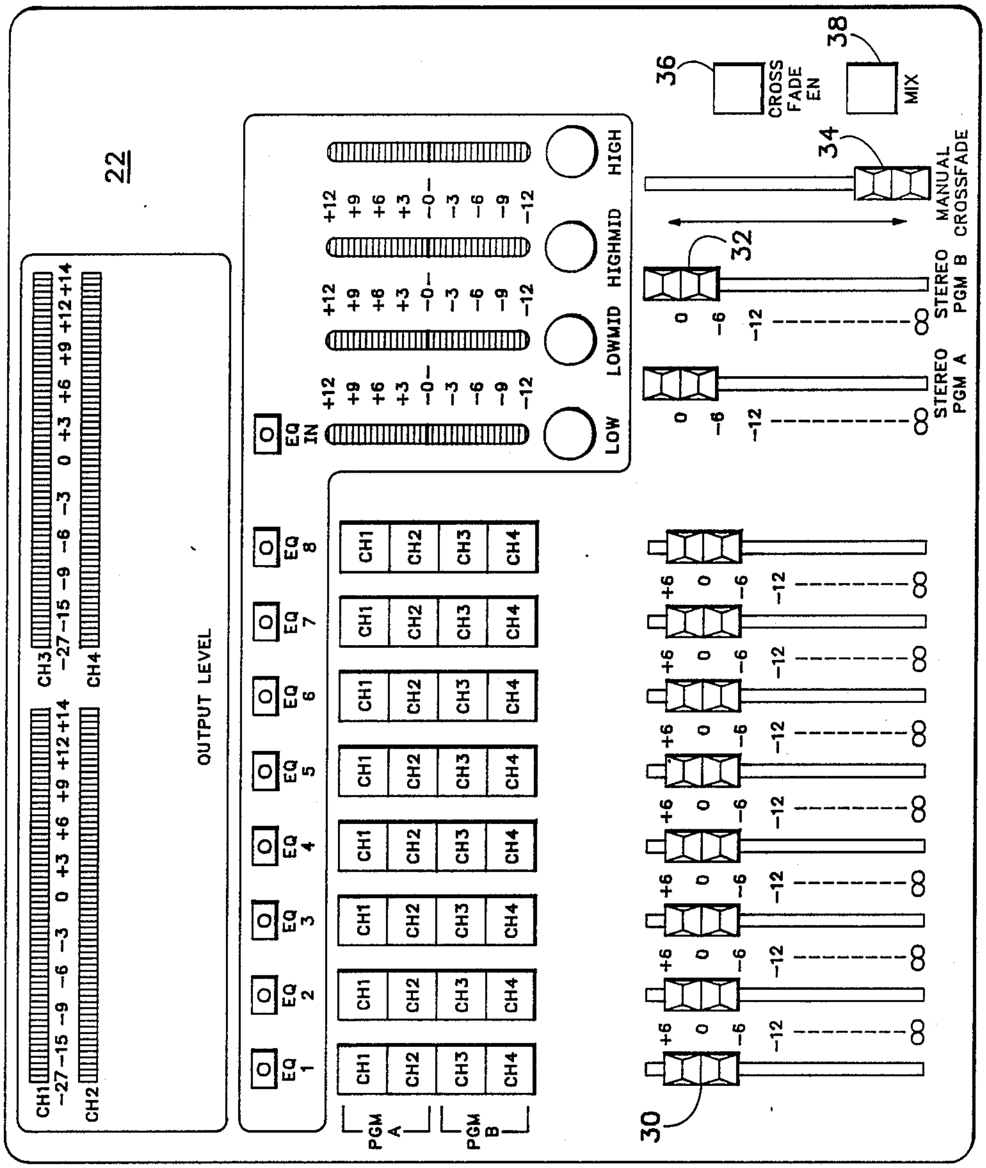
FIG. 2 is a plan view of a control panel for an audio mixer implementing the current invention.

As shown in FIG. 2 the control panel 22 has individual gain control slides 30 for each audio input channel as well as master gain control slides 32 for each output audio channel. Also a crossfade slide 34 is shown together with a crossfade enable button 36. To perform a manual crossfade from a program audio mix to a preset audio mix that is stored in a preset register of the microprocessor 24 during set up, the crossfade enable button 36 is activated and the crossfade slide 34 is moved by an operator from one extreme position to another. This causes the audio mix to change from the program mix to the preset mix, i.e., decreasing the value of the gain control signal applied to one variable gain element 16 while increasing the value of the gain control signal applied to the other variable gain element 18. To perform this audio mix automatically a mix button 38 is pushed and the audio mix occurs over a specified transition time interval.

For the automatic audio mix the microprocessor 24 produces a control function that is not linear in dB versus time. The control function is logarithmically based to compensate for the non-additive mixing property of sound. When crossfading from one source to another of equal intensity the overall output level remains essentially constant. To produce the log function the gain change in dB is converted to a voltage ratio, multiplied by a transition complete fraction, and converted back to dB. The equation for this calculation takes one of two forms, depending upon whether the gain change between the program mix and the preset mix gains is positive or negative. For the positive gain change case:

$$G_{trans}=G_{prog}+G_{delta}$$

where:

$$G_{delta}=20*log\{(t/TOTAL)*10(G_{pres}-G_{prog})/20\}$$

For the negative gain change case:

$$G_{trans}=G_{pres}+G_{delta}$$

where $G_{delta}$ is similar except t=t-TOTAL and $(G_{pres}-G_{prog})=(G_{prog}-G_{pres})$. To implement these basic equations the log and exponential functions may be accomplished with a table, with the exponential function being a simple look-up table and the log function using a binary search. Alternatively with a fast enough processor and/or math co-processor these basic equations may be equated directly. The shaping correction is added as a term to the exponential multiplier so that the scalar portion of the log function of delta gain becomes $$k-S(k)$$

where $k=t/TOTAL$ or $(t-TOTAL)/TOTAL$. The function S(k) likewise may be accomplished using a table look-up that represents the desired shaping function, such as a cosine function, or may be computed directly with a fast processor and/or math co-processor. The computational period is a function of the sampling rate of the D/A converters of the digital interface 26, which for television applications could be once per field while for film applications it might be two to four times that rate, so long as the incremental changes are smooth to the listener.

Figure 3:
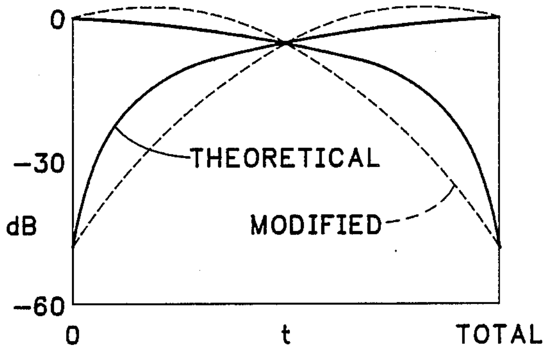
FIG. 3 is a graphic view of a crossfade as modified according to the present invention.

The crossfade function is shown in FIG. 3 where the solid line represents the theoretical crossfade of the first set of equations without the shaping correction function. The dotted line shows the theoretical crossfade as modified by the shaping of the present invention. The significant factor is that the slope of the gain changes at the limit of audibility, which is generally in the vicinity of −30 dB, is decreased so that incremental changes are not of such a magnitude as to give the impression of a "snap-on" or "snap-off" of the lower gain audio source.

Thus the present invention provides shaping of the automatic audio crossfade by adding a shaping function to the theoretical crossfade logarithmic function to decrease the slope of the crossfade function at the limit of audibility.

What is claimed is:

1. A method of automatic audio crossfading between a first audio source and a second audio source over a specified time interval comprising the steps of:

computing a gain change value for each audio source as a function of a fractional part of the specified time interval that has been completed and of a difference in gain between the audio sources for a current time increment within the specified time interval using a modified theoretical crossfade function that has a gain level versus time slope at a limit of audibility that avoids apparent snap-on or snap-off of the audio source having a lower gain level at the beginning and end of the specified time interval;

adding the respective gain change values to current gains of the respective audio sources to produce new current gain values;

applying the new current gain values to the respective audio sources;

mixing the respective audio sources to produce an output audio mix; and repeating the computing, adding, applying and mixing steps for subsequent current time increments until the specified time interval is completed.

2. An apparatus for performing an automatic audio crossfade between audio sources comprising:

means for receiving audio signals from a plurality of audio sources;

means for mixing selected ones of the audio signals to produce an audio mix output signal; and means for controlling the mixing means so that an automatic crossfade from one audio source to another in the audio mix output signal follows a modified theoretical crossfade function that has a gain level versus time slope at a limit of audibility that avoids apparent snap-on or snap-off of the audio source having a lower gain level.

3. An apparatus as recited in claim 2 wherein the mixing means comprises:

means for programmably attenuating each audio signal from the receiving means to produce attenuated audio signals; and means for combining the attenuated audio signals to produce the audio mix output signal.

4. An apparatus as recited in claim 3 wherein the controlling means comprises:

means for computing the modified theoretical crossfade function for each audio signal as a function of a specified time interval to complete the automatic audio crossfade plus a shape function and of a gain differential between audio signals to produce a separate gain control signal for each audio signal; and means for interfacing between the computing means and the programmably attenuating means to apply the separate gain control signals to the audio signals to produce the attenuated audio signals.

5. A method as recited in claim 1 wherein the computing step comprises the steps of:

converting the difference in gain to a gain ratio;

adding a shape function to the fractional part to produce a modified fractional part;

multiplying the gain ratio by the modified fractional part to produce a proportional gain ratio; and converting the proportional gain ratio to the gain change value.

* * * * *